(12) United States Patent
Gopalan et al.

(10) Patent No.: US 12,557,595 B2
(45) Date of Patent: Feb. 17, 2026

(54) METHODS FOR ELECTROSTATIC CHUCK CERAMIC SURFACING

(71) Applicant: Applied Materials, Inc., Santa Clara, CA (US)

(72) Inventors: Ramesh Gopalan, Fremont, CA (US); Robert Toshiharu Hirahara, San Jose, CA (US); Stanley Wu, Santa Clara, CA (US); Michael Prestoza Decena, Hayward, CA (US); Wendell Boyd, Santa Clara, CA (US); Siamak Salimian, Los Altos, CA (US); Thomas Brezoczky, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 887 days.

(21) Appl. No.: 17/584,503

(22) Filed: Jan. 26, 2022

(65) Prior Publication Data
US 2023/0238267 A1    Jul. 27, 2023

(51) Int. Cl.
*H01S 4/00* (2006.01)
*H01L 21/304* (2006.01)
(Continued)

(52) U.S. Cl.
CPC ........ *H01L 21/6833* (2013.01); *H01L 21/304* (2013.01); *H01L 21/68757* (2013.01)

(58) Field of Classification Search
CPC .............. H01L 21/304; H01L 21/6831; H01L 21/6833; H01L 21/6875; H01L 21/68757
See application file for complete search history.

(56) References Cited

U.S. PATENT DOCUMENTS

| 3,655,019 A | 4/1972 | Trzaska |
| 5,903,428 A | 5/1999 | Grimard et al. |

(Continued)

FOREIGN PATENT DOCUMENTS

| JP | 2005057234 A | 3/2005 |
| JP | 2018014515 A | 1/2018 |
| JP | 2021093488 A | 6/2021 |

OTHER PUBLICATIONS

PCT International Search Report for PCT/US2023/011303 dated May 17, 2023.

*Primary Examiner* — Paul D Kim
(74) *Attorney, Agent, or Firm* — Moser Taboada

(57) ABSTRACT

Methods and apparatus reduce chucking abnormalities for electrostatic chucks by ensuring proper planarizing of ceramic surfaces of the electrostatic chuck. In some embodiments, a method for planarizing an upper ceramic surface of an electrostatic chuck assembly may comprise placing the electrostatic chuck assembly in a first planarizing apparatus, altering an upper ceramic surface of the electrostatic chuck assembly, and halting the altering of the upper ceramic surface of the electrostatic chuck assembly when an $S_a$ parameter is less than approximately 0.1 microns, an $S_{dr}$ parameter is less than approximately 2.5 percent, an $S_z$ parameter is less than approximately 10 microns for any given area of approximately 10 $mm^2$ of the upper ceramic surface, or a pit-porosity depth parameter of greater than 1 micron is less than approximately 0.1 percent of area of the upper ceramic surface.

9 Claims, 3 Drawing Sheets

(51) Int. Cl.
*H01L 21/683* (2006.01)
*H01L 21/687* (2006.01)

(56) References Cited

U.S. PATENT DOCUMENTS

| | | |
|---|---|---|
| 7,052,553 B1 | 5/2006 | Shih et al. |
| 8,559,159 B2 | 10/2013 | Roy et al. |
| 8,852,348 B2 | 10/2014 | Parkhe et al. |
| 10,431,489 B2 | 10/2019 | Agarwal et al. |
| 10,679,885 B2 | 6/2020 | Boyd, Jr. et al. |
| 11,260,498 B2 * | 3/2022 | Lu .................. H01L 21/6831 |
| 2002/0050246 A1 * | 5/2002 | Parkhe ............. H01L 21/67109 |
| | | 118/500 |
| 2007/0195482 A1 | 8/2007 | Muka et al. |
| 2007/0285647 A1 | 12/2007 | Kwan et al. |
| 2008/0217291 A1 | 9/2008 | Higuma et al. |
| 2009/0037015 A1 | 2/2009 | Hofmeester et al. |
| 2009/0062959 A1 | 3/2009 | Sakhare et al. |
| 2010/0088872 A1 | 4/2010 | Shih |
| 2019/0111541 A1 | 4/2019 | Boyd, Jr. et al. |
| 2021/0005494 A1 | 1/2021 | Matyushkin et al. |
| 2021/0100087 A1 | 4/2021 | Natu et al. |
| 2021/0287924 A1 | 9/2021 | Li et al. |
| 2022/0388909 A1 | 12/2022 | Walker et al. |

* cited by examiner

METHODS FOR ELECTROSTATIC CHUCK CERAMIC SURFACING

FIELD

Embodiments of the present principles generally relate to semiconductor processing of semiconductor substrates.

BACKGROUND

Electrostatic chucks (ESC) are used to hold semiconductor wafers for processing in a process chamber. Movement of a wafer during processing or incorrect placement prior to processing can cause contamination and defects in the wafer that substantially lowers the performance of structures formed on the wafers. As ESCs age, the static coupling forces used to hold the wafer to the ESC may become irregular. The inventors have observed that the nonuniform coupling forces often cause improper functioning of the ESC which leads to misaligned clamping of the wafers and even errant coupling forces which cause contaminants due to static clamping forces remaining as the wafer is lifted off the surface of the ESC.

Accordingly, the inventors have provided improved apparatus and processes that yield higher performing electrostatic chucks.

SUMMARY

Methods and apparatus for improving the performance of electrostatic chuck ceramic surfaces are provided herein.

In some embodiments, a method for planarizing an upper ceramic surface of an electrostatic chuck assembly may comprise placing the electrostatic chuck assembly in a first planarizing apparatus, altering an upper ceramic surface of the electrostatic chuck assembly with the first planarizing apparatus, and halting the altering of the upper ceramic surface of the electrostatic chuck assembly when an arithmetical mean height ($S_a$) parameter of the upper ceramic surface is less than approximately 0.1 microns, a developed interfacial area ratio ($S_{dr}$) parameter of the upper ceramic surface is less than approximately 2.5 percent, a maximum peak to maximum valley ($S_z$) parameter of the upper ceramic surface is less than approximately 10 microns for any given area of approximately 10 mm² of the upper ceramic surface, or a pit-porosity depth parameter of greater than 1 micron on the upper ceramic surface is less than approximately 0.1 percent of area of the upper ceramic surface.

In some embodiments, the method may further include halting the altering of the upper ceramic surface of the electrostatic chuck assembly when the arithmetical mean height ($S_a$) parameter of the upper ceramic surface is less than approximately 0.1 microns and the developed interfacial area ratio ($S_{dr}$) parameter of the upper ceramic surface is less than approximately 2.5 percent, wherein the first planarizing apparatus includes bead blasting apparatus, polishing apparatus, lapping apparatus, grinding apparatus, or chemical mechanical planarization (CMP) apparatus, wherein the upper ceramic surface has a plurality of contact elements disposed upon the upper ceramic surface and wherein the plurality of contact elements has a height between approximately 2 microns and approximately 20 microns, wherein the plurality of contact elements is comprised of diamond like coating (DLC) material, altering an upper contact element surface of each of the plurality of contact elements with a second planarizing apparatus and halting the altering of the upper contact element surface of the electrostatic chuck assembly when an arithmetical mean height ($S_a$) parameter of the upper contact element surface is less than approximately 0.1 microns, a developed interfacial area ratio ($S_{dr}$) parameter of the upper contact element surface is less than approximately 2.5 percent, a maximum peak to maximum valley ($S_z$) parameter of the upper contact element surface is less than approximately 10 microns, or a pit-porosity depth parameter of greater than 1 micron on the upper contact element surface is less than approximately 0.1 percent of area of the upper contact element surface, wherein the second planarizing apparatus includes bead blasting apparatus, polishing apparatus, lapping apparatus, grinding apparatus, or chemical mechanical planarization (CMP) apparatus, determining an endpoint for halting the altering of the upper ceramic surface using data from an in-situ surface metrology apparatus to determine at least one of the arithmetical mean height ($S_a$) parameter of the upper ceramic surface, the developed interfacial area ratio ($S_{dr}$) parameter of the upper ceramic surface, the maximum peak to maximum valley ($S_z$) parameter for any given area of approximately 10 mm² of the upper ceramic surface, or the pit-porosity depth parameter of the upper ceramic surface, and/or wherein the method is used in an electrostatic chuck assembly upper ceramic surface refurbishing process to restore a refurbished electrostatic chuck assembly to enable a local center find (LCF) position operating parameter of approximately 1 mm or less or produce a sheet resistance (Rs) non-uniformity (NU) operating parameter of approximately 2 percent or less.

In some embodiments, an apparatus for supporting a wafer on an upper surface of an electrostatic chuck may comprise a plurality of contact elements deposited on the upper surface of the electrostatic chuck, wherein each of the plurality of contact elements has an upper contact element surface, and wherein the upper contact element surface has a surface morphology with an arithmetical mean height ($S_a$) parameter of less than approximately 0.1 microns, a developed interfacial area ratio ($S_{dr}$) parameter of less than approximately 2.5 percent, a maximum peak to maximum valley ($S_z$) parameter of the upper contact element surface of less than approximately 10 microns, or a pit-porosity depth parameter of greater than 1 micron of less than approximately 0.1 percent of area of the upper contact element surface.

In some embodiments, the apparatus may further include wherein the surface morphology has an arithmetical mean height ($S_a$) parameter of less than approximately 0.1 microns and a developed interfacial area ratio ($S_{dr}$) parameter of less than approximately 2.5 percent, wherein each of the plurality of contact elements has a height between approximately 2 microns and approximately 20 microns, and/or wherein each of the plurality of contact elements is comprised of a diamond like coating (DLC) material.

In some embodiments, a non-transitory, computer readable medium having instructions stored thereon that, when executed, cause a method for planarizing an upper ceramic surface of an electrostatic chuck assembly to be performed, the method may comprise placing the electrostatic chuck assembly in a first planarizing apparatus, altering an upper ceramic surface of the electrostatic chuck assembly with the first planarizing apparatus, and halting the altering of the upper ceramic surface of the electrostatic chuck assembly when an arithmetical mean height ($S_a$) parameter of the upper ceramic surface is less than approximately 0.1 microns, a developed interfacial area ratio ($S_{dr}$) parameter of the upper ceramic surface is less than approximately 2.5 percent, a maximum peak to maximum valley ($S_z$) parameter of the upper ceramic surface of less than approximately 10 microns for any given area of approximately 10 mm² of the upper ceramic surface, or a pit-porosity depth parameter of greater than 1 micron on the upper ceramic surface is less than approximately 0.1 percent of area of the upper ceramic surface.

In some embodiments, the method of the non-transitory, computer readable medium may further include halting the altering of the upper ceramic surface of the electrostatic chuck assembly when the arithmetical mean height ($S_a$) parameter of the upper ceramic surface is less than approximately 0.1 microns and the developed interfacial area ratio ($S_{dr}$) parameter of the upper ceramic surface is less than approximately 2.5 percent, altering the upper ceramic surface of the electrostatic chuck assembly using the first planarizing apparatus comprising bead blasting apparatus, polishing apparatus, lapping apparatus, grinding apparatus, or chemical mechanical planarization (CMP) apparatus, determining an endpoint for halting the altering using data from an in situ metrology apparatus to determine at least one of the arithmetical mean height ($S_a$) parameter of the upper ceramic surface, the developed interfacial area ratio ($S_{dr}$) parameter of the upper ceramic surface, the maximum peak to maximum valley ($S_z$) parameter of the upper ceramic surface of less than approximately 10 microns for any given area of approximately 10 mm² of the upper ceramic surface, or the pit-porosity depth parameter of the upper ceramic surface, wherein the upper ceramic surface has a plurality of contact elements disposed upon the upper ceramic surface and wherein the plurality of contact elements has a height between approximately 2 microns and approximately 20 microns, altering an upper contact element surface of each of the plurality of contact elements using a second planarizing apparatus and halting the altering of the upper contact element surface of the electrostatic chuck assembly when an arithmetical mean height ($S_a$) parameter of the upper contact element surface is less than approximately 0.1 microns, a developed interfacial area ratio ($S_{dr}$) parameter of the upper contact element surface is less than approximately 2.5 percent, a maximum peak to maximum valley ($S_z$) parameter of the upper contact element surface of less than approximately 10 microns, or a pit-porosity depth parameter of greater than 1 micron on the upper contact element surface is less than approximately 0.1 percent of area of the upper contact element surface, and/or determining an endpoint for halting the altering using data from an in situ metrology apparatus to determine at least one of the arithmetical mean height ($S_a$) parameter of the upper contact element surface, the developed interfacial area ratio ($S_{dr}$) parameter of the upper contact element surface, the maximum peak to maximum valley ($S_z$) parameter of the upper contact element surface of less than approximately 10 microns, or the pit-porosity depth parameter of the upper contact element surface.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
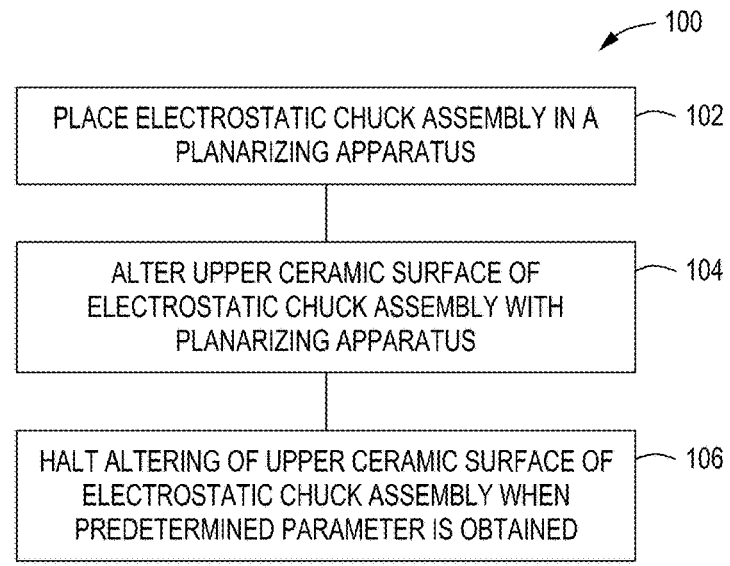
FIG. 1 is a method for planarizing an upper ceramic surface or a top surface of a contact element of an electrostatic chuck assembly in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide an improved electrostatic chuck (ESC) ceramic surface and/or wafer pad support surface. The improvements facilitate in reducing sheet resistivity non-uniformity and/or wafer positioning errors to increase the chucking performance of ESCs that operate on the Johnsen-Rahbek (J-R) principle. The surface morphology of the ceramic and pad surfaces are altered to provide specific characteristics that enhance the performance of the ESC to ensure stable and reliable operation of the ESC. The inventors have discovered that the specific quantitative surface morphology properties provide efficient and reliable charge separation and uniformity to ensure proper chucking and dechucking of wafers on the ESC.

Many current ESCs or substrate holders, particularly holders operating on the J-R principle, fail early or lose efficacy with usage or due to poor manufacturing tolerances. No current, traditional theories provide an explanation on what causes the ESCs, either new or used, to fail for loss of backside cooling gas pressure, poor wafer process uniformity, or wafer sliding due to non-uniform or unreliable chucking forces. However, the inventors have found that the failure mechanism is due to the changing surface roughness or morphology of the ceramic surface of the ESC. The inventors have further found that changes to the surface morphology of the ESC during wafer processing, such as pits which become deeper and wider, compromises the functionality of contact elements or wafer support pads. The contact elements enable uniform charge separation between a wafer backside and the upper ceramic surface of the ESC which is critical for reliable uniform chucking. The contact elements also facilitate in maintaining a uniform separation between the wafer backside and the upper ceramic surface of the ESC to allow the critical flow and uniform pressure of backside cooling gas such as, for example, but not limited to helium or argon gas. The uniform separation provided by the contact elements accommodates a mean free path for the backside gas, which, operating at pressures of 5 to 20 Torr, is in the range 2 to 8 microns. The height of the contact elements is then set to a height of 2 to 20 microns to ensure adequate and uniform thermal conduction through the backside gas. The present principles provide surface morphology parameters for ceramic surfaces and/or contact elements, such as on aluminum nitride ESCs deployed in high temperature metal deposition products processing, to ensure that high chucking performance of the ESC is obtained.

ESCs operating on the J-R principle work by having a voltage on an electrode embedded in a ceramic surface (typically 1 mm below the ceramic surface). The electric field from electrode causes a charge separation between the upper surface of the ceramic and the bottom surface or backside of the wafer. For example, a positive voltage on the electrode pulls electrons to the ceramic surface leaving a positive charge on the backside of the wafer. The attraction between the separated opposite charges provides the static chucking force of the ESC. The inventors have found that if the ceramic surface becomes too rough, gets too many pits or increased porosity, then the ceramic surface impedes the uniform flow of charges that are necessary to create a uniform charge separation. The inventors have further found that a nonuniform charge separation causes typical failure modes found in J-R ESCs including process nonuniformity= ($R_s$ NU %), chucking or dechucking issues, loss of backside cooling gas pressure, and/or wafer sliding (local center find or LCF errors).

The present principles can be used to quantify the surface morphology of ceramic surfaces and contact elements to provide specific limits on surface morphology parameters including arithmetical mean height ($S_a$), developed interfacial area ratio ($S_{dr}$), maximum peak to maximum valley ($S_z$), and pit-porosity area percentage of surface area to ensure reliable and stable chucking of substrates or wafers. The inventors have found that typical metrology methods deployed to measure the ESC surface roughness, such as stylus profilometry, do not provide enough surface detail information. The inventors have found advanced methods such as, but not limited to, laser confocal microscopy, atomic force microscopy (AFM), and the like to render the surface morphology parameters, $S_a$, $S_{dr}$, $S_z$, and the like to enable proper determination of the surface morphology for ESC surfaces. The metrology methods and parameters enable better performing new material ESC surfaces and also provide guidance for reliable refurbishment, such as through bead-blast and polishing, of used ESC surfaces.

FIG. 1 is a method 100 for planarizing an upper ceramic surface of an electrostatic chuck assembly. The electrostatic chuck assembly may include a complete ESC or only a ceramic wafer support portion of the ESC. In some embodiments, the ceramic may be aluminum oxide or aluminum nitride and the like. In block 102, the electrostatic chuck assembly is placed in a first planarizing apparatus. In some embodiments, the first planarizing apparatus may be a mechanical-based planarizing apparatus that includes lapping apparatus, grinding apparatus, polishing apparatus, bead blasting apparatus, or chemical mechanical planarization (CMP) apparatus and the like. The techniques of the present principles are not limited by the type of the planarizing apparatus. In block 104, an upper ceramic surface of the electrostatic chuck assembly is altered by the first planarizing apparatus. Specifically, the surface morphology of the upper ceramic surface is altered towards a more planarized state. In block 106, the altering of the upper ceramic surface of the electrostatic chuck assembly is halted when a predetermined parameter is obtained with regard to the surface morphology of the upper ceramic surface. In some embodiments, the parameters may be determined during a planarization process from an in-situ metrology apparatus (confocal laser, AFM, etc.) associated with a first planarizing apparatus or a second planarizing apparatus.

In some embodiments, surface morphology measurements may be taken on the upper ceramic surface prior to the altering of the ceramic surface to facilitate in altering the ceramic surface. Estimating a time duration of the altering process may be accomplished by comparing the starting surface morphology parameters to the predetermined surface morphology parameters and based on the type and process of the planarizing apparatus. In some embodiments, the halting of the altering of the upper ceramic surface of the electrostatic chuck assembly occurs when an arithmetical mean height ($S_a$) parameter of the upper ceramic surface is less than approximately 0.1 microns, a developed interfacial area ratio ($S_{dr}$) parameter of the upper ceramic surface is less than approximately 2.5 percent, a maximum peak to maximum valley ($S_z$) parameter of the upper ceramic surface is less than approximately 10 microns for an area of approximately 10 mm$^2$ of the upper ceramic surface, and/or a pit-porosity depth parameter of greater than 1 micron on the upper ceramic surface is less than approximately 0.1 percent of the area of the upper ceramic surface. The $S_z$ parameter is determined over an area which is approximately equal to a contact surface area of a contact element. A typical contact element may have a contact or support surface area of approximately 10 mm$^2$. The inventors have found that the $S_z$ parameter should not exceed a height (see height 604 of FIG. 6) of the contact element. The contact element may have a height of up to approximately 20 microns. In some embodiments, the $S_z$ parameter is less than approximately 10 microns within any given area of the upper ceramic surface of the ESC to ensure minimal negative impact on contact elements placed within any given area.

In some embodiments, the same surface morphology parameters may also be applied to surfaces of contact elements that are deposited on the ceramic surface of the electrostatic chuck. Namely that the method 100 may further comprise altering an upper contact element surface of each of the plurality of contact elements with a second planarizing apparatus and halting the altering of the upper contact element surface of the electrostatic chuck assembly when an arithmetical mean height ($S_a$) parameter of the upper contact element surface is less than approximately 0.1 microns, a developed interfacial area ratio ($S_{dr}$) parameter of the upper contact element surface is less than approximately 2.5 percent, a maximum peak to maximum valley ($S_z$) parameter of the upper contact element surface is less than approximately 10 microns, or a pit-porosity depth parameter of greater than 1 micron on the upper contact element surface is less than approximately 0.1 percent of the area of the upper contact element surface.

In some embodiments, the second planarizing apparatus may be a mechanical-based planarizing apparatus that includes lapping apparatus, grinding apparatus, polishing apparatus, bead blasting apparatus, or chemical mechanical planarization (CMP) apparatus and the like. The techniques of the present principles are not limited by the type of the planarizing apparatus. In some instances, the first planarizing apparatus and the second planarizing apparatus may be the same type of apparatus or different types of apparatus. In some embodiments, if the ceramic surface and/or the contact elements meet the predetermined parameters, the method 100 can be used in in an electrostatic chuck refurbishing process to restore an electrostatic chuck to enable a local center find (LCF) position operating parameter of approximately 1 mm or less or to produce a sheet resistance (Rs) non-uniformity (NU) operating parameter of approximately 2 percent or less.

The predetermined parameters for halting the altering process are based on the inventors' observations of the operation of the electrostatic chuck. As depicted in a view 200A of FIG. 2, an upper ceramic portion 202A of an electrostatic chuck with an embedded electrode 208 connected to a positive DC source 210 produces a positive charge 218 at the embedded electrode 208. The electric field of the embedded electrode 208 induces a negative charge layer 212A at the surface 220A of the upper ceramic portion 202A. The inventors have found that when the surface morphology of the upper ceramic portion 202A meets or exceeds the predetermined parameters as noted above, the negative charge layer 212A at the surface 222A of the upper ceramic portion 202A is evenly distributed across the surface 220A. The even distribution causes an equal and opposite positive charge layer 214A to form on a backside 224A of a wafer 204a. The equal but opposite charge layers create an attraction force that chucks the wafer 204A to the electrostatic chuck. Minimal contact pads or contact elements 206A keep the wafer 204A separated from the surface 222A of the upper ceramic portion 202A by a distance equal to the height 220 of the contact elements 206A. A small positive charge layer 216A may form on the top surface of the contact elements 206A.

Figure 2:
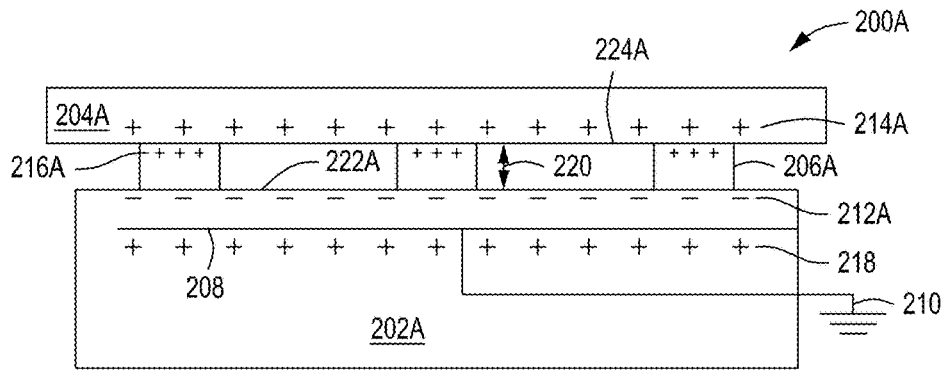
FIG. 2 depicts a cross-sectional view of an electrostatic chuck and chucking forces in accordance with some embodiments of the present principles.
Figure 2:
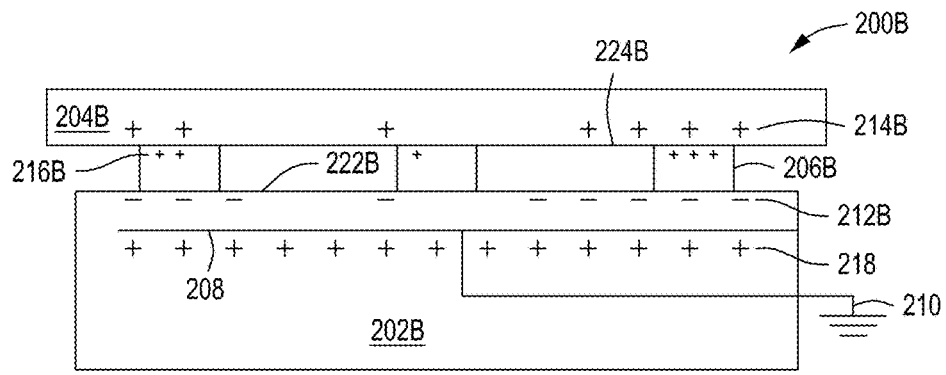

The inventors have found that when a surface 222B of a ceramic portion 202B does not meet the predetermined parameters noted above, the various charge layers become nonuniform as depicted in a view 200B of FIG. 2. The inventors discovered that when surface imperfections exceed the predetermined parameters noted above, the negative charge layer 212B is nonuniform which causes a nonuniform positive charge layer 214B to be produced on the backside 224B of the wafer 204B and also a nonuniform small positive charge layer 216B on the top surface of the contact elements 206B. In some instances, areas with higher density charge layer interactions (attraction) may cause the wafer 204B to move off center (LCF errors) when placed on the electrostatic chuck for processing. An off centered wafer can cause numerous processing errors such as nonuniform depositions, etchings, etc. which lead to performance issues of structures formed on the wafer. The nonuniform charge layers may also induce higher residence times when DC chucking power is removed. The higher residence times may cause attractive forces to be present when the wafer is lifted from the electrostatic chuck, causing surface damage to the electrostatic chuck, the wafer backside, or even dislodging of the contact elements from the ceramic surface of the electrostatic chuck. Particle contamination caused by the increased residence time of the attraction forces causes performance issues with the processed wafers.

Figure 3:
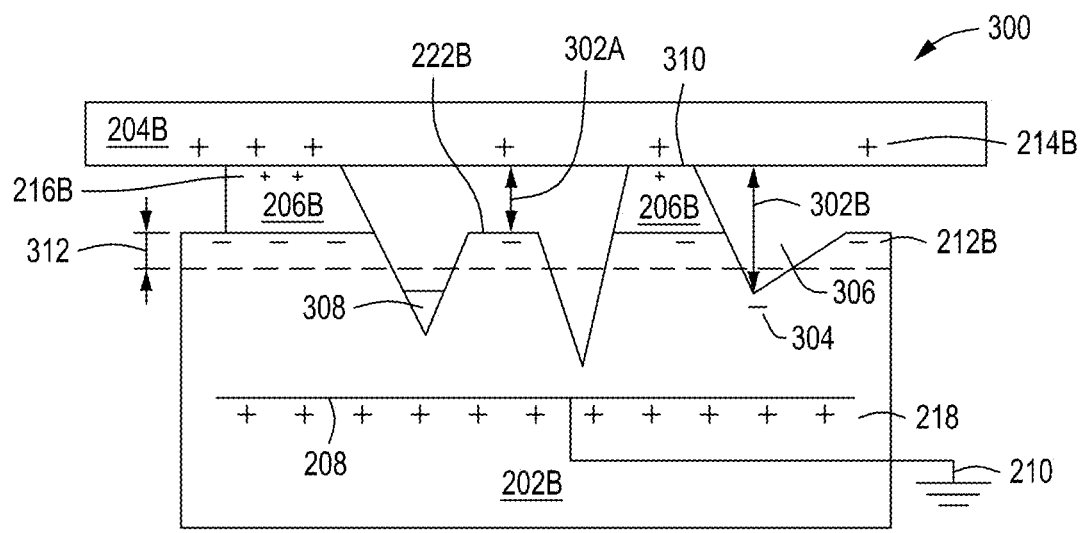
FIG. 3 depicts a cross-sectional view of a portion of an electrostatic chuck with ceramic surface and contact element surface damage in accordance with some embodiments of the present principles.

As depicted in a view 300 of FIG. 3, the inventors scrutinized the surfaces of the ceramic portion 202B of the electrostatic chuck and studied the different types of damage or roughness found on the surface 2226. Some pitting 306 on the surface 222B caused damage to the contact elements 206B, either from erosion during wafer processing or from conformal deposition of the contact elements 206B where a portion of the contact elements 308 was lost into the pits when deposited (the deposition is conformal to the underlying ceramic surface). The damaged contact elements 206B substantially reduced the performance of the contact elements 206B as less supporting surface 310 of the contact elements 206B was present. The inventors also found that the optimal separation distance 302A of the opposite charge layers on the backside of the wafer 204B and the surface 222B of the ceramic portion 202B was dramatically increased due to the surface damage of the ceramic portion 202B. For example, a pit 306 in the surface 222B increased the separation distance 302B by nearly two-fold, dramatically weakening the effect of a negative charge 304 formed at the surface which had become the bottom of the pit 306, reducing the holding force of the electrostatic chuck and increasing discharge times due to the longer path (separation distance 302B).

Figure 4:
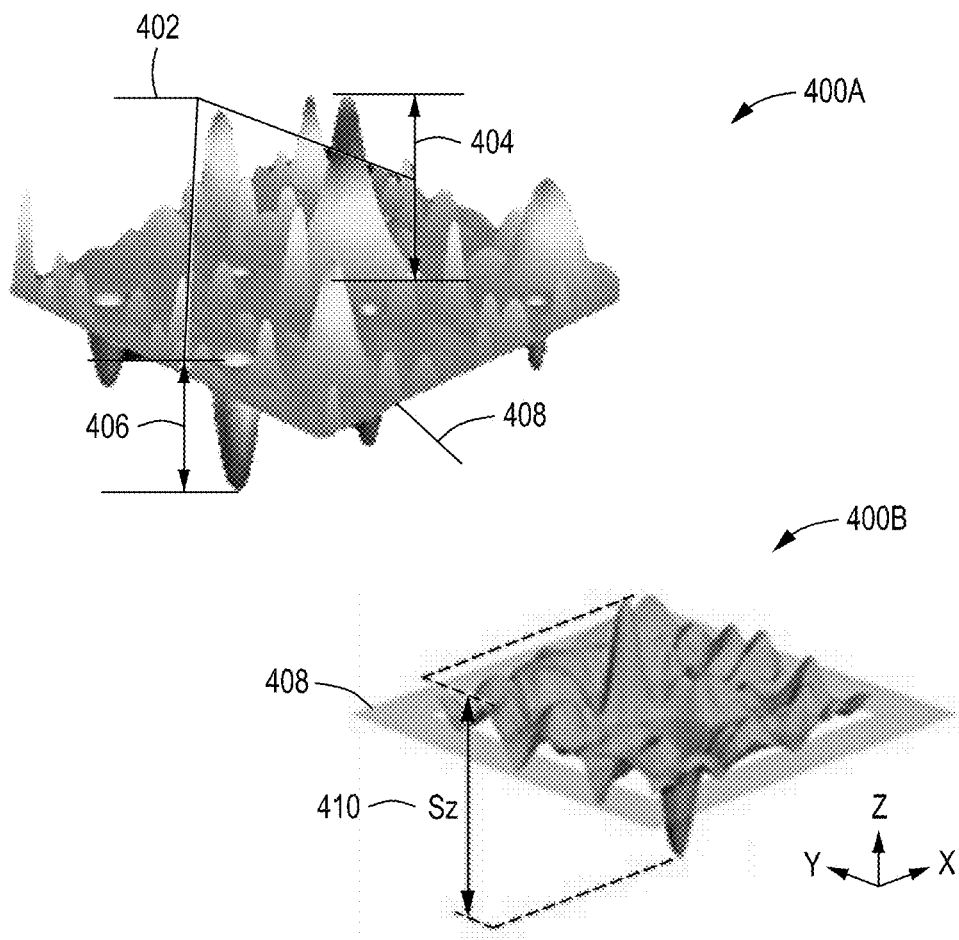
FIG. 4 depicts a three-dimensional morphology of a surface and associated parameters in accordance with some embodiments of the present principles.

The inventors attempted to use traditional contact profilometers such as linear stylus profilometers to determine roughness parameters that would substantially decrease electrostatic chuck performance. However, the inventors found that even though two electrostatic chucks measured to have the same average roughness in microinches or Ra, the chucking performance of the two electrostatic chucks varied greatly. After further study, the inventors found that the stylus type profilometer could not distinguish (Ra measured identically) between surface morphology that would alter chucking performance from surface morphology that would not substantially degrade chucking performance. The inventors sought out other means to characterize surface morphology and found that laser confocal microscopes produced a more usable three-dimensional measurement of the surface morphology. With laser confocal data, multiple planes of the ceramic surface could be measured to create a 3D model. From the 3D model data, an arithmetical mean height, $S_a$, could be determined. As depicted in a view 400A of FIG. 4, that arithmetical mean height 402 is composed of absolute values of peaks 404 and valleys 406 relative to a mean plane 408. The arithmetical mean height 402 represents the arithmetic mean of the absolute ordinate Z (x,y) with an evaluation area (surface area of the ceramic surface). $S_a$ can be written (Eq. 1) as the following where A=area of the surface:

$$Sa = \frac{1}{A} \iint_A |Z(x, y)| dx dy \qquad \text{(Eq. 1)}$$

The inventors discovered that the arithmetical mean height 402 provides stable results with regard to surface morphology of electrostatic chucks since the parameter is not significantly influenced by scratches, contamination, and measurement noise. In addition, the inventors found that a maximum peak to a maximum valley ($S_z$) 410 may also be used to further evaluate the surface morphology of the electrostatic chuck as depicted in a view 400B of FIG. 4. $S_z$ can be written (Eq. 2) as the following where $S_p$ is the peak height and $S_v$ is the valley depth:

$$Sz = Sp + Sv \qquad \text{(Eq. 2)}$$

Figure 5:
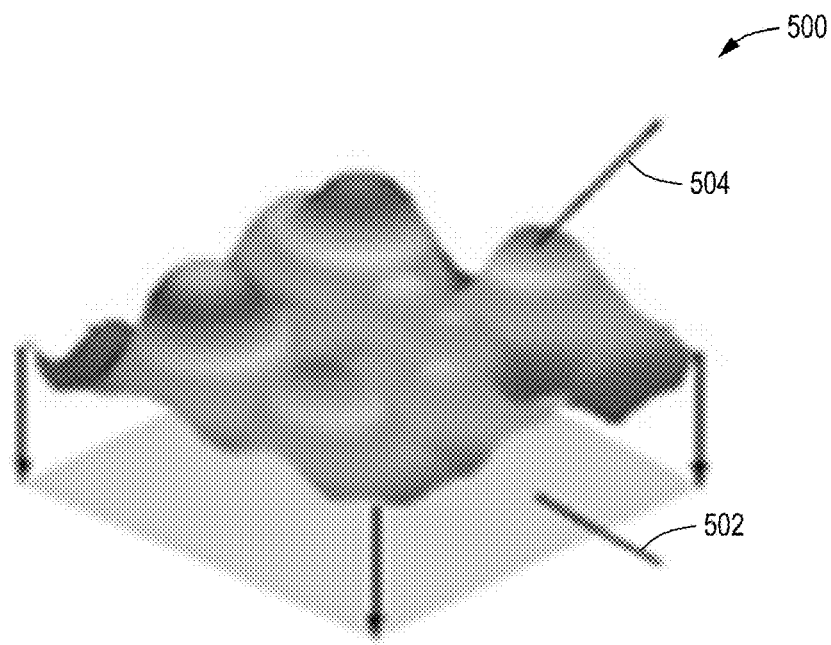
FIG. 5 depicts a three-dimensional morphology of a surface and associated parameters in accordance with some embodiments of the present principles.

The inventors also evaluated using the developed interfacial area ratio, $S_{dr}$, to further facilitate in determining viable surface morphology for electrostatic chuck ceramic surfaces. The developed interfacial area ratio is the rate of an increase in the surface area due to roughness/pitting. The increase rate is determined from a surface area $A_1$ 504 derived from the projected area $A_0$ 502 as depicted in a view 500 of FIG. 5. The ratio increases as the surface texture becomes fine and rough. In terms of $A_1$ 504 and $A_0$ 502, $S_{dr}$ can be written (Eq. 3) as the following:

$$Sdr = [(A_1/A_0) - 1] \times 100(\%) \qquad \text{(Eq. 3)}$$

The ratio can be explicitly written (Eq. 4) as:

$$Sdr = \frac{1}{A}\left[\iint_A \left(\sqrt{1+\left(\frac{\partial z(x,y)}{\partial x}\right)^2+\left(\frac{\partial z(x,y)}{\partial y}\right)^2}-1\right)dxdy\right] \quad \text{(Eq. 4)}$$

The inventors evaluated each parameter to determine the parameter's relationship to the chucking performance of the electrostatic chuck. The inventors discovered that performance of the electrostatic chuck can be enhanced when the surface morphology of the ceramic surface of the electrostatic chuck has an arithmetical mean height, $S_a$, of less than approximately 0.1 microns, a developed interfacial area ratio, $S_{dr}$, of less than approximately 2.5 percent, a maximum peak to maximum valley, $S_z$, of less than approximately 10 microns for any given area of approximately 10 mm² of the upper ceramic surface, or a pit-porosity depth parameter of greater than 1 micron on the upper ceramic surface of less than approximately 0.1 percent of the area of the upper ceramic surface. In some embodiments, a combination of an arithmetical mean height ($S_a$) of less than approximately 0.1 microns and a developed interfacial area ratio ($S_{dr}$) of less than approximately 2.5 percent provides a further enhancement of the electrostatic chuck's chucking force.

The inventors discovered that defects in the surfaces that were not detectable by conventional means, such as through contact profilometry or optical measurements, significantly contributed to charge non-uniformity on the surface and also on the wafer backside, the charge separation non-uniformity between the surface and the wafer back side, and contaminant formation (popping wafers due to residual charge during dechucking, etc.). In addition, the inventors discovered that the defects also affected the ability to discharge the chucking voltage when the chucking voltage potential was removed, leading to increase residence periods for the chucking charges, causing the wafers to stick to the electrostatic chuck when being lifted from the chuck after processing has completed. The inventors discovered that the pits create a longer discharge path (see, e.g., separation distance 302B of FIG. 3) which increases the discharge time. The inventors found that determining an area of the pit/porosity defects at a depth 312 (see FIG. 3) of 1 micron provided significant enhancements in the electrostatic chuck if the area of the pit/porosity defects was less than 0.1 percent of the area of the ceramic surface of the electrostatic chuck. Deep pits (e.g., >5 microns) compromised the contact element coatings and pits greater than 1 micron compromised the electrical contact to the back side of the wafer and electron conduction on the top surface of the ceramic, causing unstable or nonuniform charge separation, leading to electrostatic chucking failures including Rs NU % increase, wafer sliding (LCF errors), backside gas pressure faults, and poor chucking/dechucking. In the same manner, the $S_a$, $S_z$, and $S_{dr}$ surface parameters may be set to a threshold to reduce the surface defect levels so as to no longer substantially impact the chucking performance of the electrostatic chucks.

Figure 6:
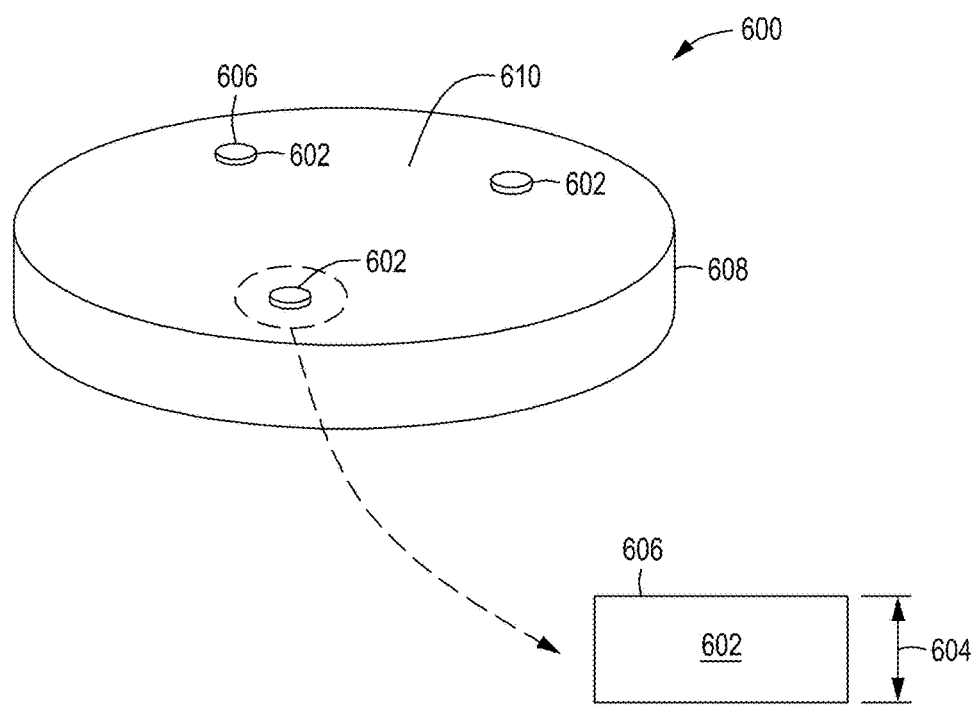
FIG. 6 depicts an electrostatic chuck assembly with contact elements in accordance with some embodiments of the present principles.

The inventors also found that similar techniques of the present principles can be applied to the contact elements 602 as depicted in a view 600 of FIG. 6. A plurality of contact elements 602 may be deposited on a ceramic surface 610 of a ceramic portion 608 of an electrostatic chuck. In some embodiments, the contact elements 602 may have a height 604 of approximately 2 microns to approximately 20 microns. The height 604 of the contact elements 602 facilitate in providing a charge separation between the ceramic surface 610 of the electrostatic chuck and a wafer placed on a top surface 606 of the contact elements 602. The contact elements 602 also provide a uniform separation for flowing of a backside gas for cooling of the wafer. In some embodiments, the contact elements 602 may be deposited using a diamond like coating (DLC) material and the like. The contact elements 602 are conformally deposited onto the ceramic surface 610. If the ceramic surface 610 meets the predetermined parameters described herein, the ceramic surface 610 may have a top surface 606 that closely mimics an optimal surface based on the techniques provided herein.

If the ceramic surface 610 has not been prepared according to the present principles, the top surface 606 may contain the same deficiencies as found in the ceramic surface 610. The inventors have found that the same surface morphology parameters may also be applied to the top surface 606 of the contact elements 602 independent of the surface morphology of the ceramic surface 610. Providing a surface morphology on the top surface 606 of the contact elements 602 ensures that the contact elements are performing at a high-performance level. Ensuring that both surface morphologies of the contact elements and the ceramic portion of the electrostatic chuck meet or exceed the parameters defined herein, enables an electrostatic chuck to perform at the chuck's highest level with minimal wafer positioning error, reduced or no contaminant formation, and reduced sheet resistance nonuniformity.

The inventors found that the present principles can not only be applied to new ESC manufacturing processes but can also be applied to a ceramic surface or contact element surface refurbishing process to restore a refurbished electrostatic chuck assembly to enable a local center find (LCF) position operating parameter of approximately 1 mm or less or to produce a sheet resistance (Rs) non-uniformity (NU) operating parameter of approximately 2 percent or less for the refurbished electrostatic chuck.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for planarizing an upper ceramic surface of an electrostatic chuck assembly, comprising:
   placing the electrostatic chuck assembly in a first planarizing apparatus;
   altering the upper ceramic surface of the electrostatic chuck assembly with the first planarizing apparatus; and
   halting the altering of the upper ceramic surface of the electrostatic chuck assembly when an arithmetical mean height ($S_a$) parameter of the upper ceramic surface is less than approximately 0.1 microns, a developed interfacial area ratio ($S_{dr}$) parameter of the upper ceramic surface is less than approximately 2.5 percent, a maximum peak to maximum valley ($S_z$) parameter of the upper ceramic surface is less than approximately 10 microns for any given area of approximately 10 mm² of the upper ceramic surface, or a pit-porosity depth parameter of greater than 1 micron on the upper ceramic surface is less than approximately 0.1 percent of area of the upper ceramic surface.

2. The method of claim 1, wherein the electrostatic chuck assembly has an embedded electrode.

3. The method of claim 1, wherein the first planarizing apparatus includes bead blasting apparatus, polishing apparatus, lapping apparatus, grinding apparatus, or chemical mechanical planarization (CMP) apparatus.

4. The method of claim 1, wherein the upper ceramic surface has a plurality of contact elements disposed upon the upper ceramic surface and wherein the plurality of contact elements has a height between approximately 2 microns and approximately 20 microns.

5. The method of claim 4, wherein the plurality of contact elements is comprised of diamond like coating (DLC) material.

6. The method of claim 4, further comprising:
altering an upper contact element surface of each of the plurality of contact elements with a second planarizing apparatus; and
halting the altering of the upper contact element surface of each of the plurality of contact elements when an arithmetical mean height ($S_a$) parameter of the upper contact element surface is less than approximately 0.1 microns, a developed interfacial area ratio ($S_{dr}$) parameter of the upper contact element surface is less than approximately 2.5 percent, a maximum peak to maximum valley ($S_z$) parameter of the upper contact element surface is less than approximately 10 microns, or a pit-porosity depth parameter of greater than 1 micron on the upper contact element surface is less than approximately 0.1 percent of area of the upper contact element surface.

7. The method of claim 6, wherein the second planarizing apparatus includes bead blasting apparatus, polishing apparatus, lapping apparatus, grinding apparatus, or chemical mechanical planarization (CMP) apparatus.

8. The method of claim 1, further comprising:
determining an endpoint for halting the altering of the upper ceramic surface using data from an in-situ surface metrology apparatus to determine at least one of the arithmetical mean height ($S_a$) parameter of the upper ceramic surface, the developed interfacial area ratio ($S_{dr}$) parameter of the upper ceramic surface, the maximum peak to maximum valley ($S_z$) parameter for any given area of approximately 10 mm² of the upper ceramic surface, or the pit-porosity depth parameter of the upper ceramic surface.

9. The method of claim 1, further comprising: halting the altering of the upper ceramic surface of the electrostatic chuck assembly when a local center find (LCF) position operating parameter of the electrostatic chuck assembly is approximately 1 mm or less or halting the altering of the upper ceramic surface of the electrostatic chuck assembly when a sheet resistance (Rs) non-uniformity (NU) operating parameter of the electrostatic chuck assembly is approximately 2 percent or less.

* * * * *